(12) United States Patent
Yen et al.

(10) Patent No.: US 9,401,361 B2
(45) Date of Patent: Jul. 26, 2016

(54) SEMICONDUCTOR ARRANGEMENT HAVING FIRST SEMICONDUCTOR DEVICE OVER FIRST SHALLOW WELL HAVING FIRST CONDUCTIVITY TYPE AND SECOND SEMICONDUCTOR DEVICE OVER SECOND SHALLOW WELL HAVING SECOND CONDUCTIVITY TYPE AND FORMATION THEREOF

(71) Applicant: TAIWAN SEMICONDUCTOR MANUFACTURING COMPANY LIMITED, Hsin Chu (TW)

(72) Inventors: Hsiao-Tsung Yen, Tainan (TW); Cheng-Wei Luo, Hsinchu (TW)

(73) Assignee: TAIWAN SEMICONDUCTOR MANUFACTURING COMPANY LIMITED, Hsin Chu (TW)

( * ) Notice: Subject to any disclaimer, the term of this patent is extended or adjusted under 35 U.S.C. 154(b) by 24 days.

(21) Appl. No.: 14/178,454

(22) Filed: Feb. 12, 2014

(65) Prior Publication Data

US 2015/0228651 A1 Aug. 13, 2015

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)
*H01L 27/092* (2006.01)
*H01L 21/8238* (2006.01)

(52) U.S. Cl.
CPC .... *H01L 27/0921* (2013.01); *H01L 21/823892* (2013.01); *H01L 27/0928* (2013.01)

(58) Field of Classification Search
CPC . H01L 27/11; H01L 27/1104; H01L 27/0928; H01L 29/49; H01L 29/94
USPC .................................. 257/368, 369, 371, 393
See application file for complete search history.

(56) References Cited

U.S. PATENT DOCUMENTS

| | | | |
|---|---|---|---|
| 7,368,789 B1* | 5/2008 | Dhaoui et al. ................ 257/369 |
| 2004/0144998 A1* | 7/2004 | Chow ...................... H01L 27/02 257/213 |
| 2014/0050020 A1* | 2/2014 | Lee ...................... G11C 7/1054 365/158 |

* cited by examiner

*Primary Examiner* — Hoai V Pham
(74) *Attorney, Agent, or Firm* — Cooper Legal Group, LLC

(57) ABSTRACT

A semiconductor arrangement and method of formation are provided. A semiconductor arrangement includes a first semiconductor device adjacent a second semiconductor device. The first semiconductor device includes a first gate over a first shallow well in a substrate. A first active area is in the first shallow well on a first side of the first gate. The second semiconductor device includes a second gate over a second shallow well. A third active area is in the second shallow well on a first side of the second gate. The second shallow well abuts the first shallow well in the substrate to form a P-N junction. The P-N junction increases capacitance of the semiconductor arrangement, as compared to a device without such a P-N junction.

20 Claims, 10 Drawing Sheets

SEMICONDUCTOR ARRANGEMENT HAVING FIRST SEMICONDUCTOR DEVICE OVER FIRST SHALLOW WELL HAVING FIRST CONDUCTIVITY TYPE AND SECOND SEMICONDUCTOR DEVICE OVER SECOND SHALLOW WELL HAVING SECOND CONDUCTIVITY TYPE AND FORMATION THEREOF

BACKGROUND

A semiconductor arrangement comprises one or more semiconductor devices. In a semiconductor device, such as a transistor, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
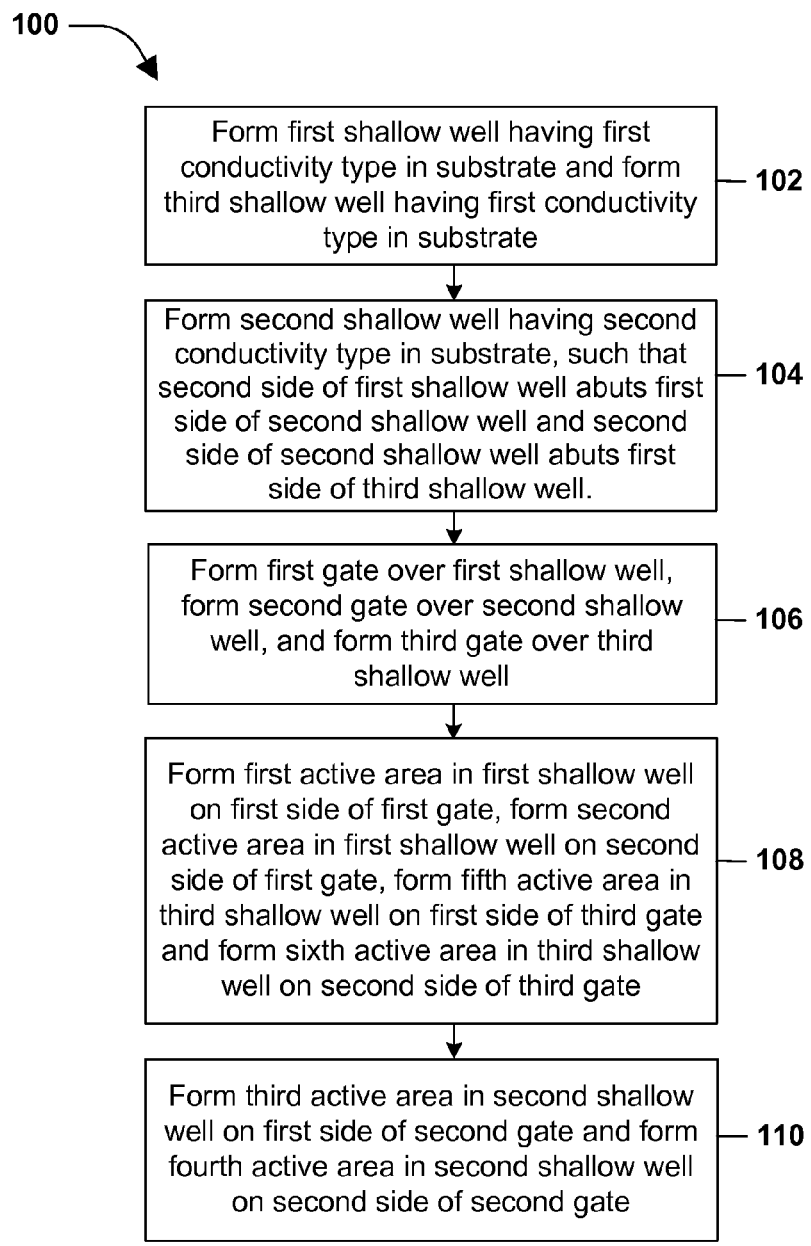
FIG. 1 is a flow diagram illustrating a method of forming a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein.

Figure 8:
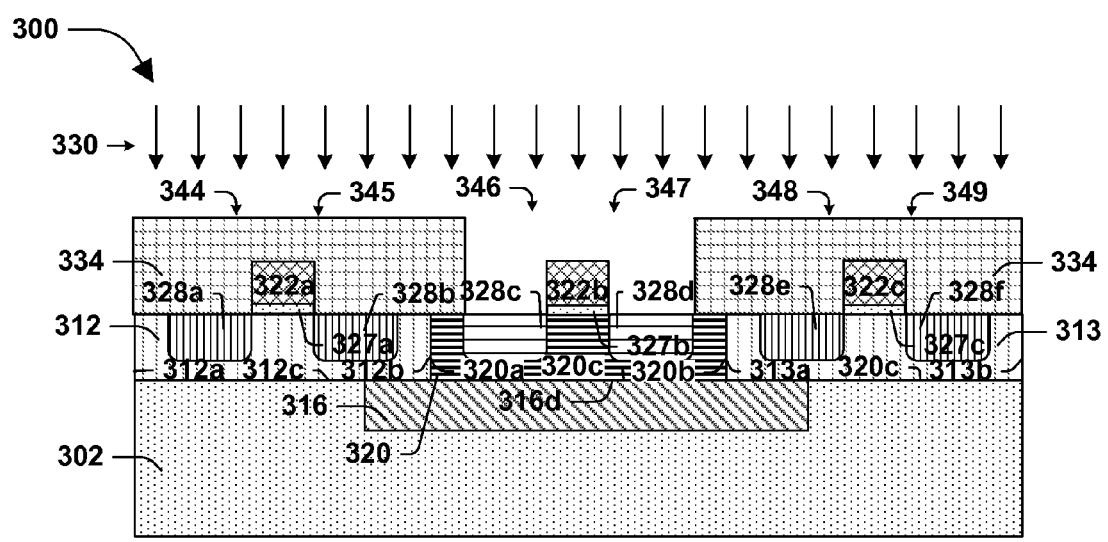
FIG. 8 is an illustration of a semiconductor arrangement, in accordance with some embodiments.
Figure 9:
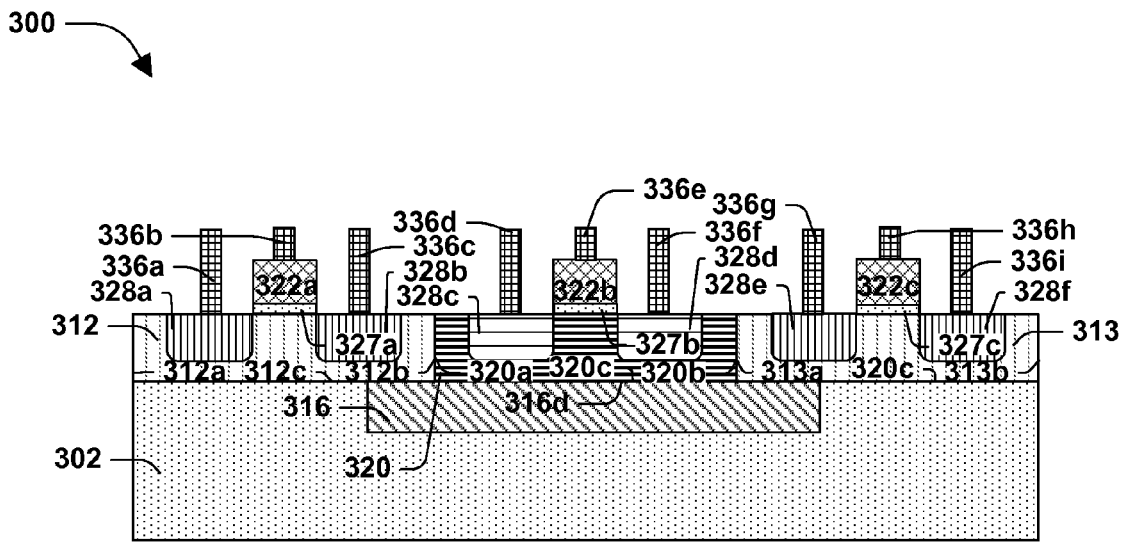
FIG. 9 is an illustration of a semiconductor arrangement, in accordance with some embodiments.
Figure 10:
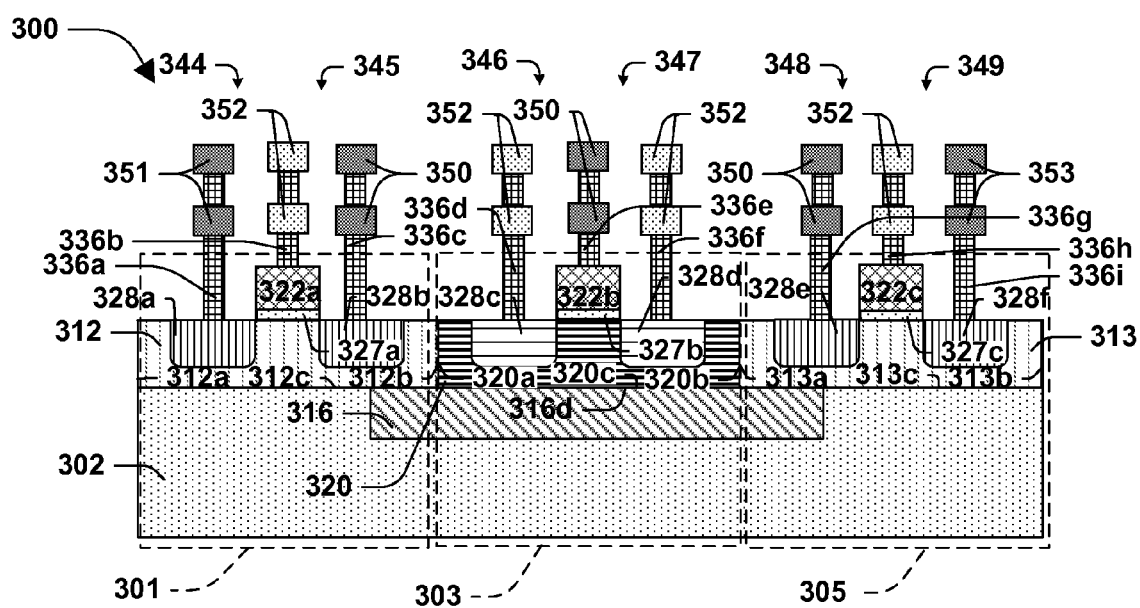
FIG. 10 is an illustration of a semiconductor arrangement, in accordance with some embodiments.

A method 100 of forming a semiconductor arrangement 300 according to some embodiments is illustrated in FIG. 1 and one or more structures formed thereby at various stages of fabrication are illustrated in FIGS. 3-12. According to some embodiments, such as illustrated in FIG. 10, a first semiconductor device 301 comprises a first gate 322a over a first shallow well 312, the first shallow well 312 formed in a substrate 302. In some embodiments, the first semiconductor device 301 comprises a first active area 328a on a first side 344 of the first gate 322a and a second active area 328b on a second side 345 of the first gate 322a. In some embodiments, the semiconductor arrangement 300 comprises a second semiconductor device 303 comprising a second gate 322b over a second shallow well 320, the second shallow well 320 formed in the substrate 302 adjacent the first shallow well 312, such that a second side 312b of the first shallow well 312 abuts a first side 320a of the second shallow well 320. In some embodiments, the second semiconductor device 303 comprises a third active area 328c on a first side 346 of the second gate 322b and a fourth active area 328d on a second side 347 of the second gate 322b. In some embodiments, the semiconductor arrangement 300 comprises a third semiconductor device 305 comprising a third gate 322c over a third shallow well 313, the third shallow well 313 formed in the substrate 302 adjacent the second shallow well 320, such that a second side 320b of the second shallow well 320 abuts a first side 313a of the third shallow well 313. In some embodiments, the third semiconductor device 305 comprises a fifth active area 328e on a first side 348 of the third gate 322c and a sixth active area 328f on a second side 349 of the third gate 322c. In some embodiments, a deep well 316 is under at least one of the first shallow well 312, the second shallow well 320 or the third shallow well 313. In some embodiments, a third side 312c of the first shallow well 312 abuts a fourth side 316d of the deep well 316. In some embodiments, a third side 320c of the second shallow region 320 abuts the fourth side 316d of the deep well 316. In some embodiments, a third side 313c of the third shallow region 313 abuts the fourth side 316d of the deep well 316. In some embodiments, the first shallow well 312 and the third shallow well 313 comprise a first conductivity type, and the second shallow well 320 comprises a second conductivity type. In some embodiments, the first conductivity type is at least one of a p-type or an n-type. In some embodiments, the second conductivity type is p-type if the first conductivity type is n-type and the second conductivity type is n-type if the first conductivity type is p-type. In some embodiments, the deep well 316 comprises at least one of the first conductivity type or the second conductivity type. In some embodiments, the substrate 302 comprises the second conductivity type when the deep well 316 comprises the first conductivity type. In some embodiments, the substrate 302 comprises the first conductivity type when the deep well 316 comprises the second conductivity type.

Figure 3:
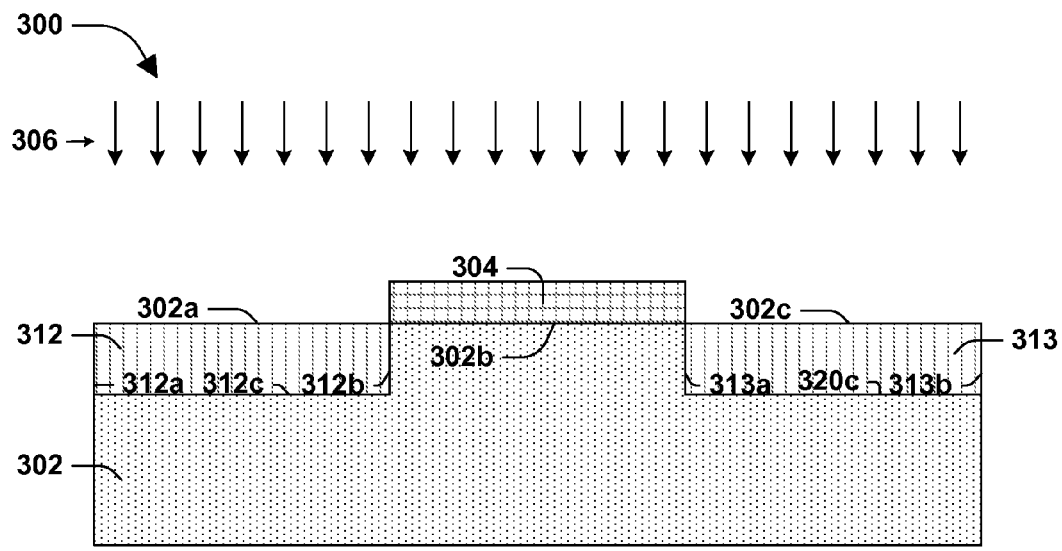
FIG. 3 is an illustration of a semiconductor arrangement, in accordance with some embodiments.

At 102, the first shallow well 312 having the first conductivity type is formed in the substrate 302 and the third shallow well 313 having the first conductivity type is formed in the substrate 302, as illustrated in FIG. 3, according to some embodiments. In some embodiments, the substrate 302 comprises silicon. According to some embodiments, the substrate 302 comprises at least one of an epitaxial layer, a silicon-on-insulator (SOI) structure, a wafer, or a die formed from a wafer. In some embodiments, the substrate 302 comprises at least one of the first conductivity type or the second conductivity type. In some embodiments, the first shallow well 312 and the third shallow well 313 are formed by a first implant 306. In some embodiments, a first mask 304 is formed over a second portion 302b of a surface of the substrate 302, such that a first portion 302a of the surface of the substrate 302 and a third portion 302c of the surface of the substrate 302 are exposed. In some embodiments, the first implant 306 comprises at least one of an n-type dopant or a p-type dopant, such that the first implant 306 forms the first shallow well 312 comprising the first conductivity type and forms the third shallow well 313 comprising the first conductivity type. In some embodiments, the first implant 306 is low energy, such as between about 1 keV to about 10 keV.

Figure 4:
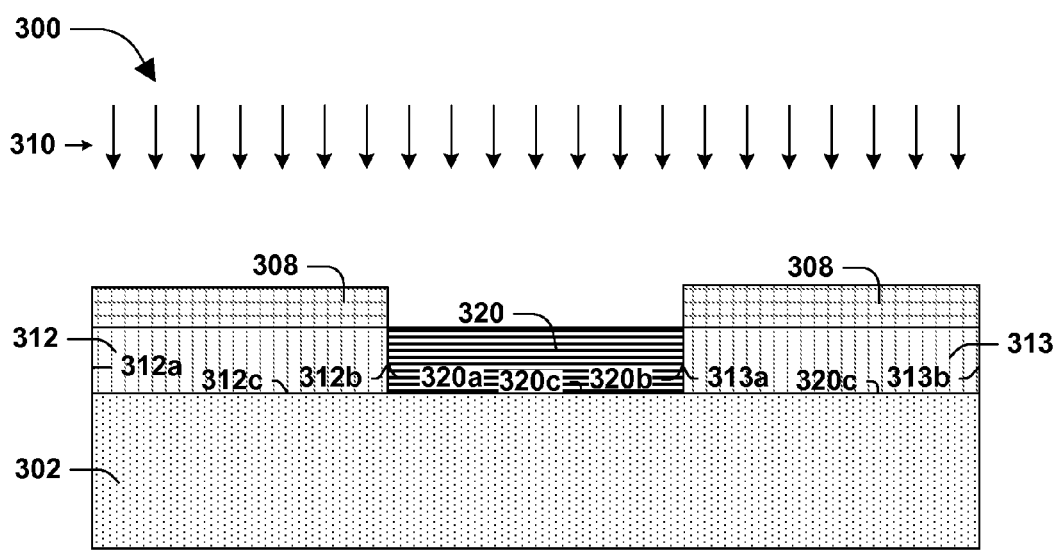
FIG. 4 is an illustration of a semiconductor arrangement, in accordance with some embodiments.
Figure 5:
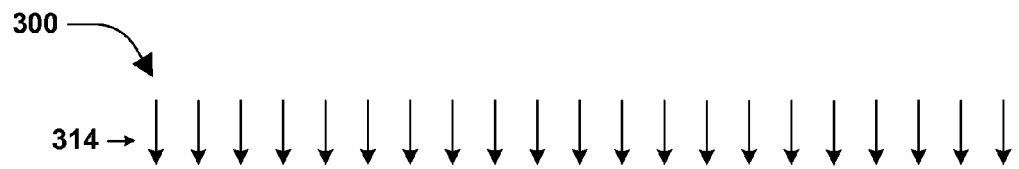
FIG. 5 is an illustration of a semiconductor arrangement, in accordance with some embodiments.
Figure 5:
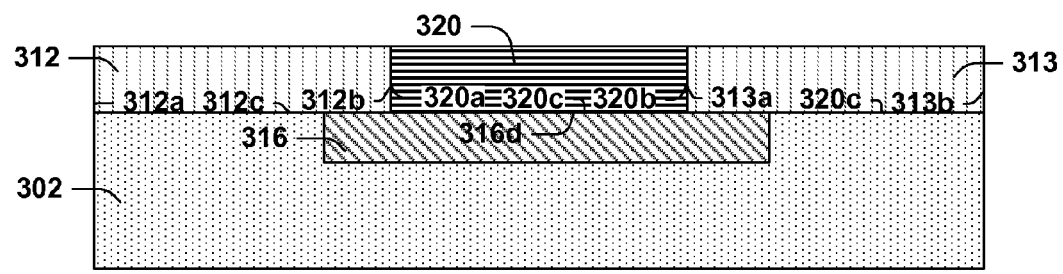

At 104, the second shallow well 320 having the second conductivity type is formed in the substrate 302, such that the second side 312b of the first shallow well 312 abuts the first side 320a of the second shallow well 320 and the second side 320b of the second shallow well 320 abuts the first side 313a of the third shallow well 313, as illustrated in FIG. 4, according to some embodiments. In some embodiments, the second shallow well 320 is formed by a second implant 310. In some embodiments, a second mask 308 is formed over the first shallow well 312 and the third shallow well 313, such that the second portion 302b of the surface of the substrate 302 is exposed. In some embodiments, the second implant 310 comprises at least one of an n-type dopant or a p-type dopant, such that the second implant 310 forms the second shallow well 320 comprising the second conductivity type. In some embodiments, the second implant 310 is low energy, such as between about 1 keV to about 10 keV. In some embodiments, the first implant 306 energy and the second implant 310 energy are substantially similar. In some embodiments, a deep well 316 is formed in the substrate 302, as illustrated in FIG. 5. In some embodiments, the deep well 316 is formed by a third implant 314. In some embodiments, the deep well 316 is formed under at least one of the first shallow well 312, the second shallow well 320, or the third shallow well 313, such that the fourth side 316d of the deep well 316 is in contact with at least one of the third side 312c of the first shallow well 312, the third side 320c of the second shallow well 320, or the third side 313c of the third shallow well 313. In some embodiments, the third implant 314 comprises at least one of an n-type dopant or a p-type dopant, such that the deep well 316 comprises at least one of the first conductivity type or the second conductivity type. In some embodiments, the third implant 314 is high energy, such as between about 8 keV to about 100 keV. In some embodiments, a third mask (not shown) is formed over at least a portion of the first shallow well 312 and the third shallow well 313, such that the deep well 316 is implanted through the first shallow well 312, the second shallow well 320 and the third shallow well 313 so as to be under the second shallow well 320 and under at least some of the first shallow well 312 and under at least some of the third shallow well 313. In some embodiments, the deep well 316 comprises the first conductivity type. In some embodiments, three P-N junctions are formed between the deep well 316, the first shallow well 312, the second shallow well 320 and the third shallow well 313. In some embodiments, a first P-N junction is formed between the second side 312b of the first shallow well 312 and the first side 320a of the second shallow well 320. In some embodiments, a second P-N junction is formed between the second side 320b of the second shallow well 320 and the first side 313a of the third shallow well 313. In some embodiments, a third P-N junction is formed between the third side 320c of the second shallow well 320 and the fourth side 316d of the deep well 316. In some embodiment, the P-N junctions produce additional capacitance as compared to a semiconductor arrangement that does not have such P-N junctions.

Figure 6:
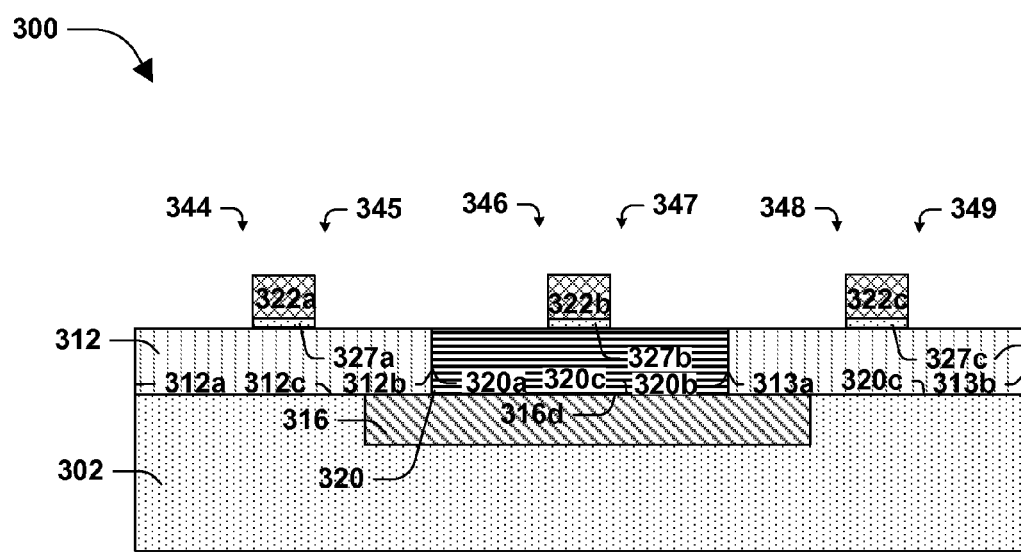
FIG. 6 is an illustration of a semiconductor arrangement, in accordance with some embodiments.

At 106, a first gate 322a over a first gate dielectric 327a is formed over the first shallow well 312, a second gate 322b over a second gate dielectric 327b is formed over the second shallow well 320, and a third gate 322c over a third gate dielectric 327c is formed over the third shallow well 313, as illustrated in FIG. 6, according to some embodiments. In some embodiments, the first gate dielectric 327a comprises a high dielectric constant material in contact with the surface of the first shallow well 312, and the first gate 322a comprises a conductive material, such as metal. In some embodiments, the second gate dielectric 327b comprises a high dielectric constant material in contact with the surface of the second shallow well 320, and the second gate 322b comprises a conductive material, such as metal. In some embodiments, the third gate dielectric 327c comprises a high dielectric constant material in contact with the surface of the third shallow well 313, and the third gate 322c comprises a conductive material, such as metal.

Figure 7:
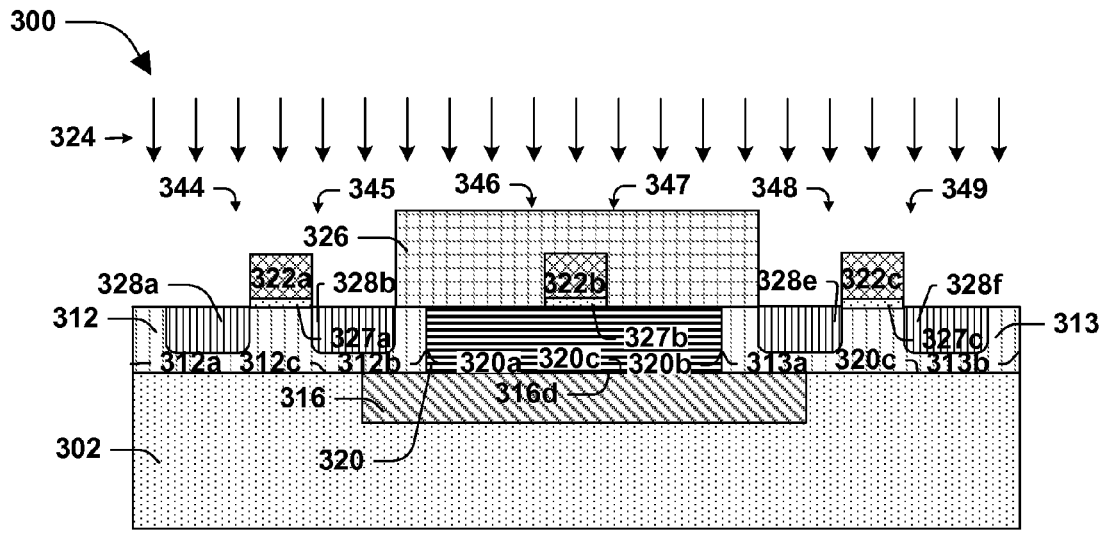
FIG. 7 is an illustration of a semiconductor arrangement, in accordance with some embodiments.

At 108, the first active area 328a is formed in the first shallow well 312 on the first side 344 of the first gate 322a, the second active area 328b is formed in the first shallow well 312 on the second side 345 of the first gate 322a, the fifth active area 328e is formed in the third shallow well 313 on the first side 348 of the third gate 322c, and the sixth active area 328f is formed in the third shallow well 313 on the second side 349 of the third gate 322c, as illustrated in FIG. 7, according to some embodiments. In some embodiments, the first active area 328a, the second active area 328b, the fifth active area 328e, and the sixth active area 328f are formed by a fourth implant 324. In some embodiments, a fourth mask 326 is formed over the second shallow well 320, such that the first shallow well 312 and the third shallow well 313 are exposed. In some embodiments, the fourth implant 324 comprises at least one of an n-type dopant or a p-type dopant, such that the fourth implant 324 forms the first active area 328a, the second active area 328b, the fifth active area 328e, and the sixth active area 328f to comprise at least one of the first conductivity type or the second conductivity type. In some embodiments, the first active area 328a, the second active area 328b, the fifth active area 328e, and the sixth active area 328f comprise the first conductivity type if the first shallow well 312 and the third shallow well 313 comprise the second conductivity type. In some embodiments, the first active area 328a, the second active area 328b, the fifth active area 328e, and the sixth active area 328f comprise the first conductivity type if the first shallow well 312 and the third shallow well 313 comprise the first conductivity type. In some embodiments, the first active area 328a comprises at least one of a source or a drain. In some embodiments, the second active area 328b comprises a source if the first active area 328a comprises a drain, and the second active area 328b comprises a drain if the first active area 328a comprises a source. In some embodiments, the fifth active area 328e comprises at least one of a source or a drain. In some embodiments, the sixth active area 328f comprises a source if the fifth active area 328e comprises a drain, and the sixth active area 328f comprises a drain if the fifth active area 328e comprises a source.

Figure 11:
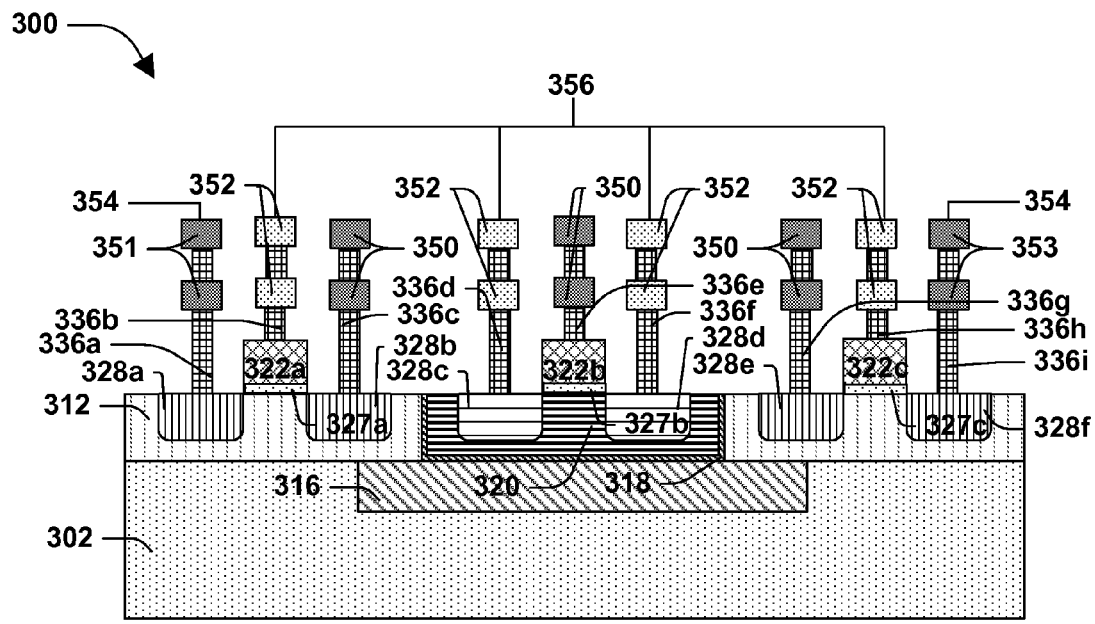
FIG. 11 is an illustration of a semiconductor arrangement, in accordance with some embodiments.
Figure 12:
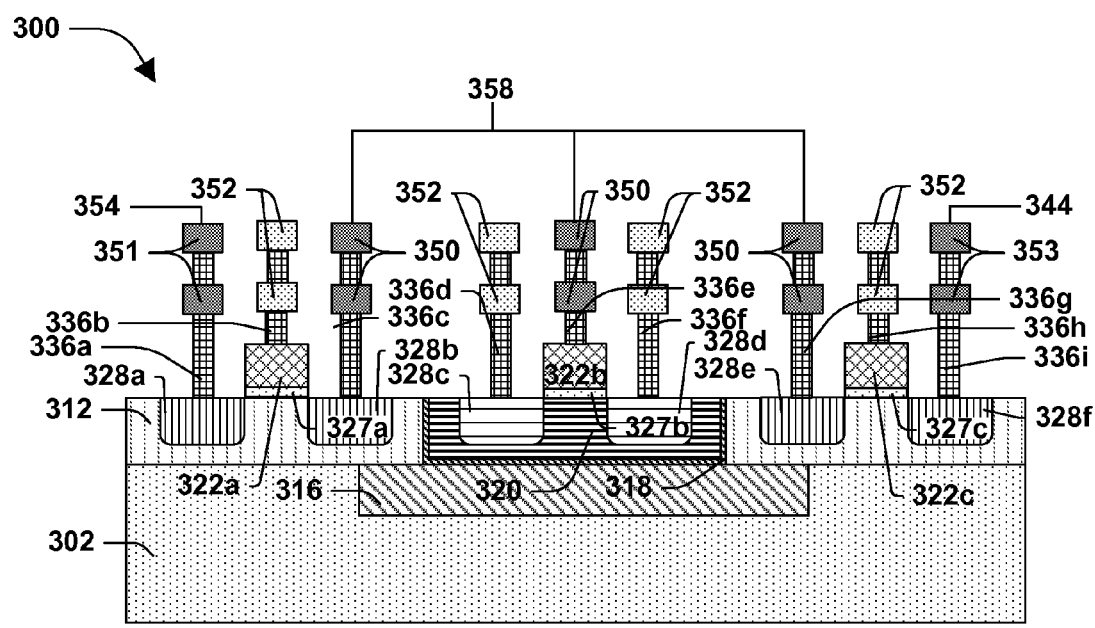
FIG. 12 is an illustration of a semiconductor arrangement, in accordance with some embodiments.

At 110, the third active area 328c is formed in the second shallow well 320 on the a first side 346 of the second gate 322b, and the fourth active area 328d is formed in the second shallow well 320 on the second side 347 of the second gate 322b, as illustrated in FIG. 8, according to some embodiments. In some embodiments, the third active area 328c and the fourth active area 328d are formed by a fifth implant 330. In some embodiments, a fifth mask 334 is formed over the first shallow well 312 and the third shallow well 313, such that the second shallow well 320 is exposed. In some embodiments, the fifth implant 330 comprises at least one of an n-type dopant or a p-type dopant, such that the fifth implant 330 forms the third active area 328c and the fourth active area 328d to comprise at least one of the first conductivity type or the second conductivity type. In some embodiments, the third active area 328c and the fourth active area 328d comprise the first conductivity type if the second shallow well 320 comprises the second conductivity type. In some embodiments, the third active area 328c and the fourth active area 328d comprise the first conductivity type if the second shallow well 320 comprises the first conductivity type. In some embodiments, the third active area 328c comprises at least one of a source or a drain. In some embodiments, the fourth active area 328d comprises a source if the third active area 328c comprises a drain, and the fourth active area 328d comprises a drain if the third active area 328c comprises a source. In some embodiments, a first via 336a is formed over and in contact with the first active area 328a, a second via 336b is formed over and in contact with the first gate 322a, and a third via 336c is formed over and in contact with the second active area 328b, as illustrated in FIG. 9. In some embodiments, a fourth via 336d is formed over and in contact with the third active area 328c, a fifth via 336e is formed over and in contact with the second gate 322b, and a sixth via 336f is formed over and in contact with the fourth active area 328d. In some embodiments, a seventh via 336g is formed over and in contact with the fifth active area 328e, an eighth via 336h is formed over and in contact with the third gate 322c, and a ninth via 336i is formed over and in contact with the sixth active area 328f. In some embodiments, the vias 336 comprise a conductive material, such as metal. In some embodiments, a first metal 350 is over and connected to the third via 336c, the fifth via 336e and the seventh via 336g, as illustrated in FIG. 10. In some embodiments, a second metal 352 is over and connected to the second via 336b, the fourth via 336d, the sixth via 336f and the eighth via 336h. In some embodiments, a third metal 351 is over and connected to the first via 336a. In some embodiments, a fourth metal 353 is connected to and over the ninth via 336i. In some embodiments, the first metal 350, the second metal 352, the third metal 351 and the fourth metal 353 comprise the same metal. In some embodiments, the third metal 351 and the fourth metal 353 are connected to a voltage supply 354, as illustrated in FIG. 11. In some embodiments, the voltage supply 354 comprises at least one of ground, a first voltage bias 356 or a second voltage bias 358. In some embodiments, the second metal 352 is connected to the first voltage bias 356. In some embodiments, the first metal 350 is connected to the second voltage bias 358, as illustrated in FIG. 12. In some embodiments, the first voltage bias 356 is at least one of a positive bias or a negative bias. In some embodiments, the second voltage bias 358 is a negative bias when the first voltage bias is a positive bias and the second voltage bias is a positive bias when the first voltage bias is a negative bias. In some embodiments, the first voltage bias 356 and the second voltage bias 358 are substantially equal in terms of absolute value, such that the first voltage bias 356 is +5V when the second voltage 358 bias is −5V. In some embodiments, when the first voltage bias 356 is applied, the semiconductor arrangement 300 comprises at least one of a PMOS varactor or an NMOS varactor device. In some embodiments, the semiconductor arrangement 300 comprises the PMOS varactor device when the second voltage bias 358 is applied, if the semiconductor device 300 comprises the NMOS varactor device when the first voltage bias 356 is applied, or the semiconductor arrangement 300 comprises the NMOS varactor device when the second voltage bias 358 is applied, if the semiconductor device 300 comprises the PMOS varactor device when the first voltage bias 356 is applied. In some embodiments, the first voltage bias 356 and the second voltage bias 358 are used to control a tuning ratio, where the tuning ratio is higher than a tuning ratio of a device without such P-N junctions.

Figure 2:
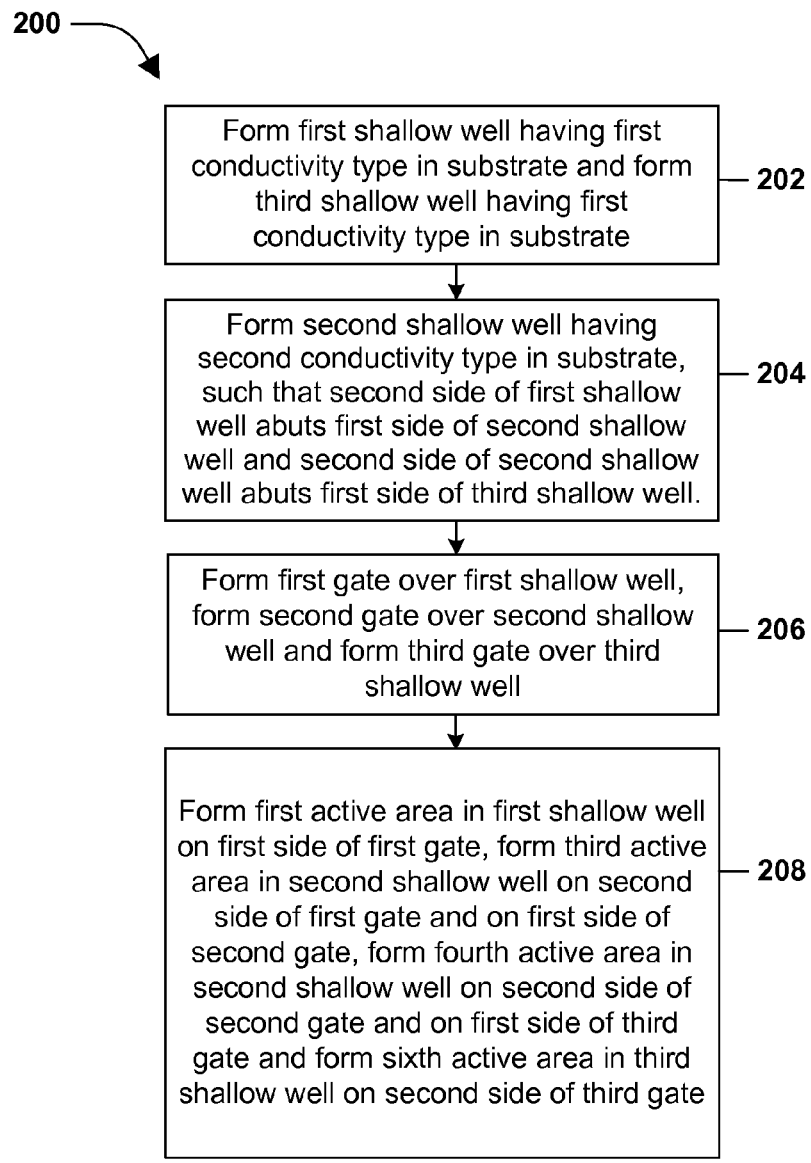
FIG. 2 is a flow diagram illustrating a method of forming a semiconductor arrangement, in accordance with some embodiments.
Figure 16:
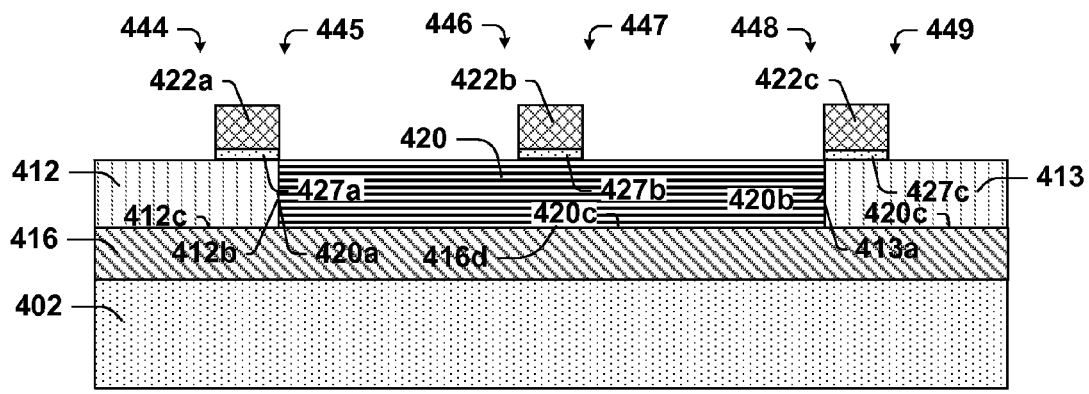
FIG. 16 is an illustration of a semiconductor arrangement, in accordance with some embodiments.
Figure 17:
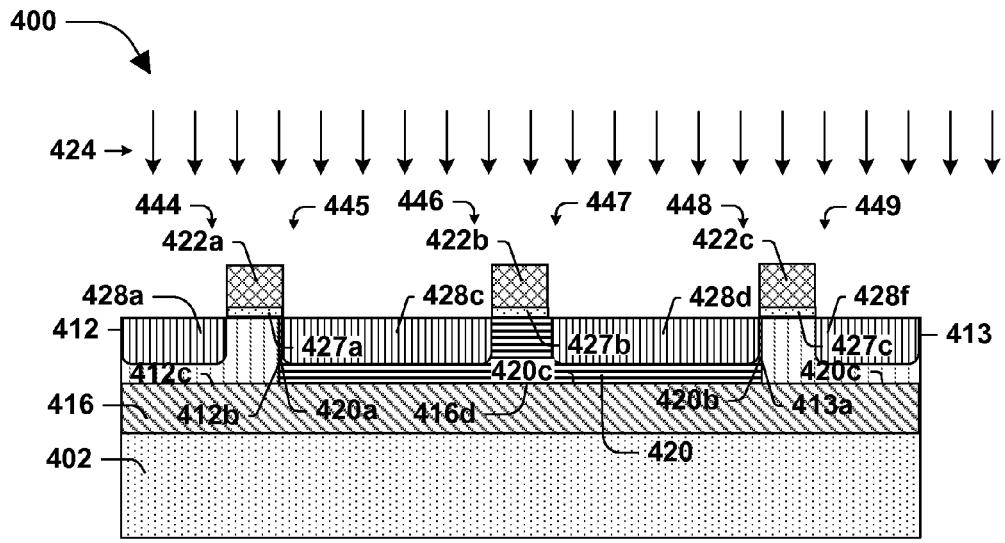
FIG. 17 is an illustration of a semiconductor arrangement, in accordance with some embodiments.
Figure 18:
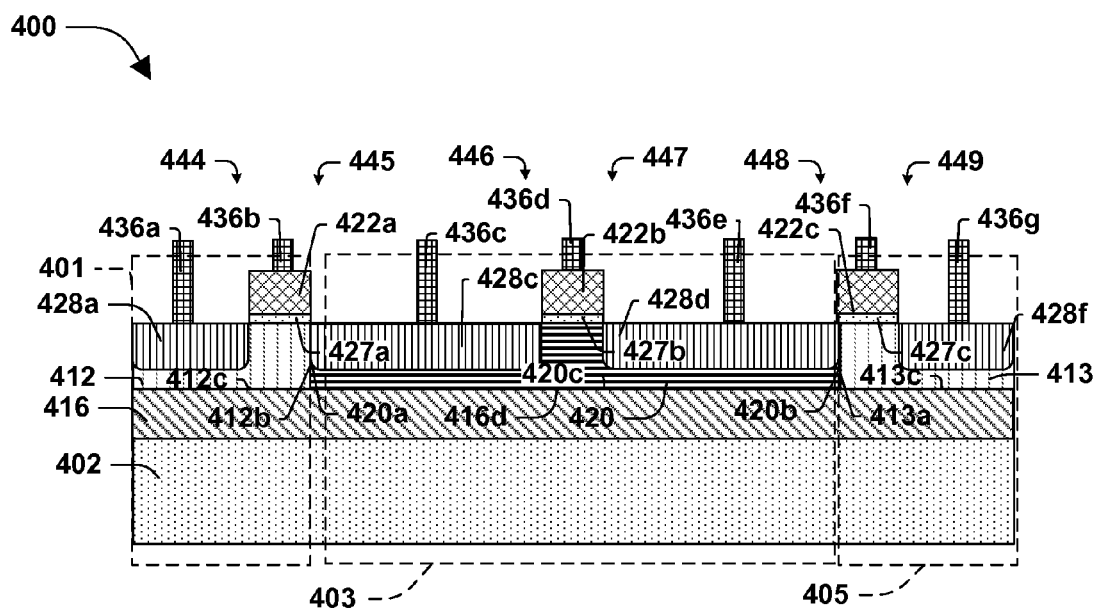
FIG. 18 is an illustration of a semiconductor arrangement, in accordance with some embodiments.

A method 200 of forming a semiconductor arrangement 400 according to some embodiments is illustrated in FIG. 2 and one or more structures formed thereby at various stages of fabrication are illustrated in FIGS. 13-18. According to some embodiments, such as illustrated in FIG. 18, a first semiconductor device 401 comprises a first gate 422a over a first shallow well 412, the first shallow well 412 formed in a substrate 402. In some embodiments, the first semiconductor device 401 comprises a first active area 428a on a first side 444 of the first gate 422a. In some embodiments, the semiconductor arrangement 400 comprises a second semiconductor device 403 comprising a second gate 422b over a second shallow well 420, the second shallow well 420 formed in the substrate 402 adjacent the first shallow well 412, such that a second side 412b of the first shallow well 412 abuts a first side 420a of the second shallow well 420. In some embodiments, the second semiconductor device 403 comprises a third active area 428c on a first side 446 of the second gate 422b and on a second side 445 of the first gate 422a, and a fourth active area 428d on a second side 447 of the second gate 422b. In some embodiments, the semiconductor arrangement 400 comprises a third semiconductor device 405 comprising a third gate 422c over a third shallow well 413, the third shallow well 413 formed in the substrate 402 adjacent the second shallow well 420, such that a second side 420b of the second shallow well 420 abuts a first side 413a of the third shallow well 413. In some embodiments, the third semiconductor device 405 comprises a sixth active area 428f on a second side 449 of the third gate 422c. In some embodiments, a deep well 416 is under at least one of the first shallow well 412, the second shallow well 420 or the third shallow well 413. In some embodiments, a third side 412c of the first shallow well 412 abuts a fourth side 416d of the deep well 416. In some embodiments, a third side 420c of the second shallow region 420 abuts the fourth side 416d of the deep well 416. In some embodiments, a third side 413c of the third shallow region 413 abuts the fourth side 416d of the deep well 416. In some embodiments, the first shallow well 412 and the third shallow well 413 comprise a first conductivity type, and the second shallow well 420 comprises a second conductivity type. In some embodiments, the first conductivity type is at least one of a p-type or an n-type. In some embodiments, the second conductivity type is p-type if the first conductivity type is n-type and the second conductivity type is n-type if the first conductivity type is p-type. In some embodiments, the deep well 416 comprises at least one of the first conductivity type or the second conductivity type. In some embodiments, the substrate 402 comprises at least one of the first conductivity type or the second conductivity type. In some embodiments, the substrate 402 comprises the second conductivity type when the deep well 416 comprises the first conductivity type. In some embodiments, the substrate 402 comprises the first conductivity type when the deep well 416 comprises the second conductivity type.

Figure 13:
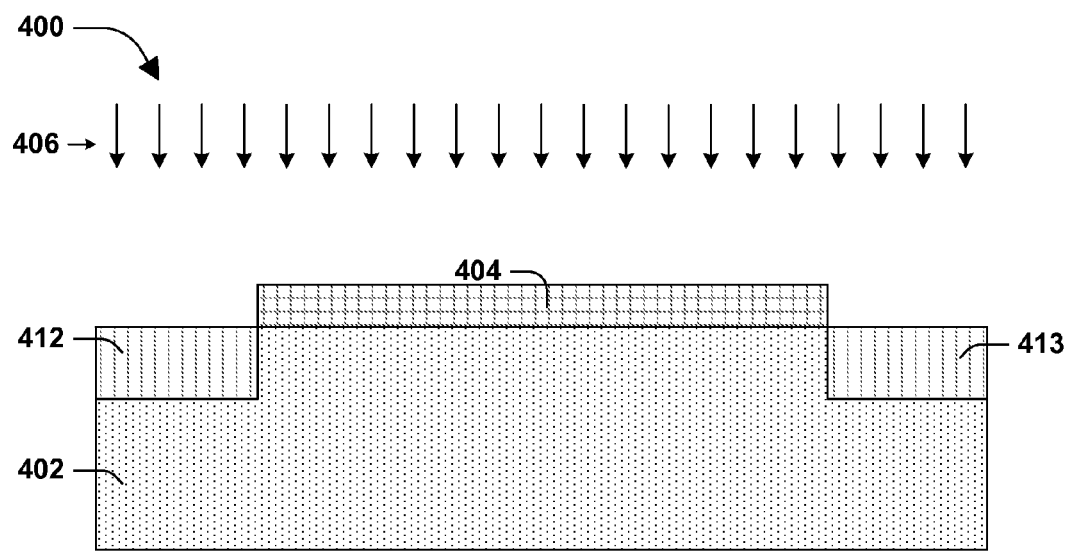
FIG. 13 is an illustration of a semiconductor arrangement, in accordance with some embodiments.

At 202, the first shallow well 412 having the first conductivity type is formed in the substrate 402 and the third shallow well 413 having the first conductivity type is formed in the substrate 402, as illustrated in FIG. 13, according to some embodiments. In some embodiments, the substrate 402, the first shallow well 412 and the third shallow well 413 are formed, such as with a first implant 406 and a first mask 404, as described above with regards to the substrate 302, the first shallow well 312 and the third shallow well 313, as illustrated in FIG. 3.

Figure 14:
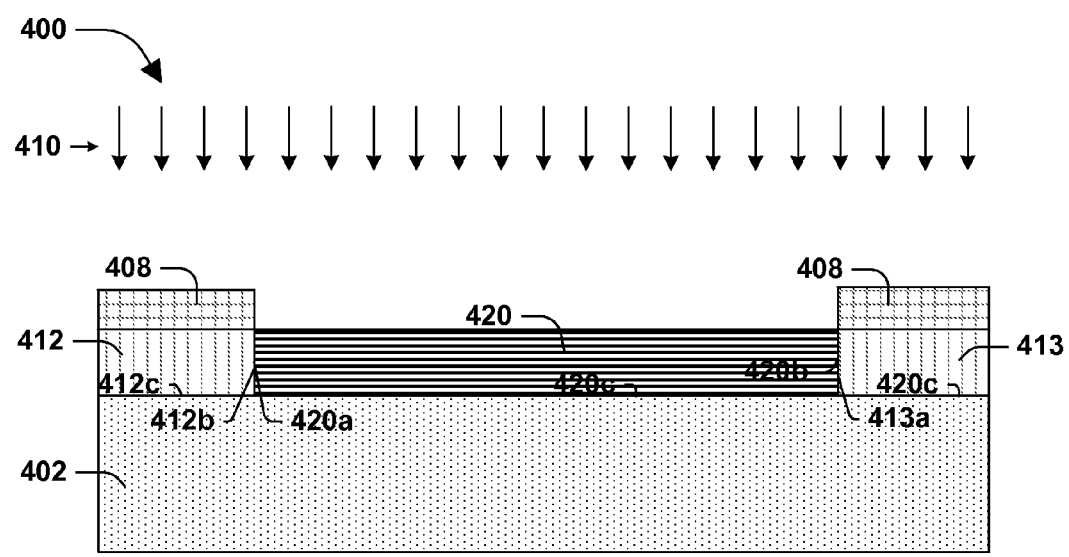
FIG. 14 is an illustration of a semiconductor arrangement, in accordance with some embodiments.
Figure 15:
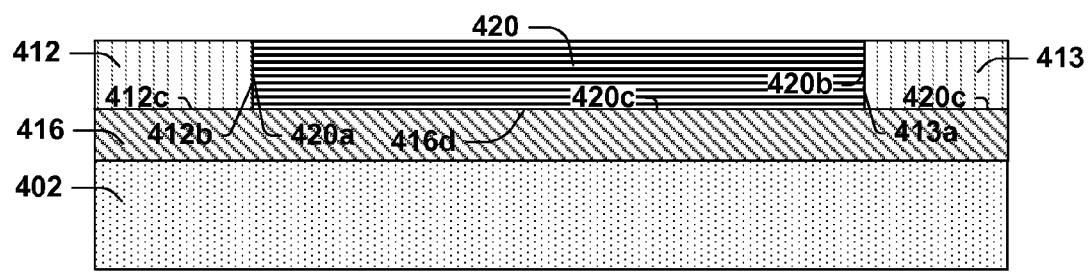
FIG. 15 is an illustration of a semiconductor arrangement, in accordance with some embodiments.

At 204, the second shallow well 420 having the second conductivity type is formed in the substrate 402, such that the second side 412b of the first shallow well 412 abuts the first side 420a of the second shallow well 420 and the second side 420b of the second shallow well 420 abuts the a first side 413a of the third shallow well 413, as illustrated in FIG. 14, according to some embodiments. In some embodiments, the second shallow well 420 is formed, such as with a second implant 410 and a second mask 408, as described above with regards to the second shallow well 320, as illustrated in FIG. 4. In some embodiments, the deep well 416 is formed in the substrate 402, as illustrated in FIG. 15. In some embodiments, the deep well 416 is formed, such as with a third implant 414, as described above with regards to the deep well 316, as illustrated in FIG. 5. In some embodiments, the deep well 416 is not formed.

At 206, the first gate 422a over a first gate dielectric 427a is formed over the first shallow well 412, the second gate 422b over a second gate dielectric 427b is formed over the second shallow well 420, and the third gate 422c over a third gate dielectric 427c is formed over the third shallow well 413, as illustrated in FIG. 16, according to some embodiments. In some embodiments, the first gate 422a and the first gate dielectric 427a, the second gate 422b and the second gate dielectric 427b and the third gate 422c and the third gate dielectric 427c are formed as described above with regards to the first gate 322a and the first gate dielectric 327a, the second gate 322b and the second gate dielectric 327b and the third gate 322c and the third gate dielectric 327c, as illustrated in FIG. 6.

At 208, the first active area 428a is formed in the first shallow well 412 on the first side 444 of the first gate 422a, the third active area 428c is formed in the second shallow well 420 on the second side 445 of the first gate 422a and on the first side 446 of the second gate 422b, the fourth active area 428d is formed in the second shallow well 420 on the second side 447 of the second gate 422b and on the first side 448 of the third gate 422c and the sixth active area 428f is formed in the third shallow well 413 on the second side 449 of the third gate 422c, as illustrated in FIG. 17, according to some embodiments. In some embodiments, the first active area 428a, the third active area 428c, the fourth active area 428d, and the sixth active area 428f are formed by a fourth implant 424. In some embodiments, the fourth implant 424 comprises at least one of an n-type dopant or a p-type dopant, such that the fourth implant 424 forms the first active area 428a, the third active area 428c, the fourth active area 428d, and the sixth active area 428f to comprise at least one of the first conductivity type or the second conductivity type. In some embodiments, the first active area 428a, the third active area 428c, the fourth active area 428d, and the sixth active area 428f comprise the first conductivity type if the first shallow well 412 and the third shallow well 413 comprise the second conductivity type. In some embodiments, the first active area 428a, the third active area 428c, the fourth active area 428d, and the sixth active area 428f comprise the first conductivity type if the first shallow well 412 and the third shallow well 413 comprise the first conductivity type. In some embodiments, the third active area 428c and the fourth active area 428d comprise the first conductivity type if the second shallow well 420 comprises the second conductivity type. In some embodiments, the third active area 428c and the fourth active area 428d comprise the second conductivity type if the second shallow well 420 comprises the first conductivity type. In some embodiments, the first active area 428a comprises at least one of a source or a drain. In some embodiments, the third active area 428c comprises a source if the first active area 428a comprises a drain, and the third active area 428c comprises a drain if the first active area 428a comprises a source. In some embodiments, the fourth active area 428d comprises at least one of a source or a drain. In some embodiments, the sixth active area 428f comprises a source if the fourth active area 428d comprises a drain, and the sixth active area 328f comprises a drain if the fourth active area 428d comprises a source. In some embodiments, a first via 436a is formed over and in contact with the first active area 428a, a second via 436b is formed over and in contact with the first gate 422a, and a third via 436c is formed over and in contact with the third active area 428c, as illustrated in FIG. 18. In some embodiments, a fourth via 436d is formed over and in contact with the second gate 422b and a fifth via 436e is formed over and in contact with the fourth active area 428d. In some embodiments, a sixth via 436f is formed over and in contact with the third gate 422c and a seventh via 436g is formed over and in contact with the sixth active area 428f. In some embodiments, the vias 436 comprise a conductive material, such as metal. In some embodiments, a first voltage bias is applied to the first via 436a, the fourth via 436d, and the seventh via 436g. In some embodiments, a second voltage bias is applied to the second via 436b, the third via 436c, the fifth via 436e, and the sixth via 436f. In some embodiments, the first voltage bias is at least one of positive or negative, and the second voltage bias is negative if the first voltage bias is positive or the second voltage bias is positive if the first voltage bias is negative. In some embodiments, a first voltage bias is applied to the fourth via 436d. In some embodiments, a second voltage bias is applied to the first via 436a, the third via 436c, the fifth via 436e and the seventh via 436g. In some embodiments, a first voltage bias is applied to the first via 436a, the second via 436b, the fourth via 436d, the sixth via 436f and the seventh via 436g. In some embodiments, a second voltage bias is applied to the third via 436c and the fifth via 436e. In some embodiments, applying the first voltage bias and the second voltage bias to different components of the semiconductor arrangement 400 alters the function of the semiconductor arrangement 400, such that the semiconductor arrangement 400 comprises an NMOS varactor device when a first voltage bias is applied and a PMOS varactor device when a second voltage bias is applied.

According to some embodiments, a semiconductor arrangement comprises a first semiconductor device and a second semiconductor device. In some embodiments, the first semiconductor device comprises a first gate over a first shallow well formed in a substrate, the first shallow well comprising a first conductivity type, a first active area in the first shallow well on a first side of the first gate and a second active area in the first shallow well on a second side of the first gate. In some embodiments, the second semiconductor device is adjacent the first semiconductor device. In some embodiments, the second semiconductor device comprises a second gate over a second shallow well formed in the substrate, the second shallow well comprising a second conductivity type, a third active area in the second shallow well on a first side of the second gate and a fourth active area in the second shallow well on a second side of the second gate. In some embodiments, a second side of the first shallow well abuts a first side of the second shallow well.

According to some embodiments, a semiconductor arrangement comprises a first semiconductor device and a second semiconductor device. In some embodiments, the first semiconductor device comprises a first gate over a first shallow well formed in a substrate, the first shallow well comprising a first conductivity type and a first active area in the first shallow well on a first side of the first gate. In some embodiments, the second semiconductor device is adjacent the first semiconductor device. In some embodiments, the second semiconductor device comprises a second gate over a second shallow well formed in the substrate, the second shallow well comprising a second conductivity type, and a third active area in the second shallow well on a first side of the second gate. In some embodiments, a second side of the first shallow well abuts a first side of the second shallow well.

According to some embodiments, a method of forming a semiconductor arrangement, comprises forming a first shallow well in a substrate, the first shallow well comprising a first conductivity type and forming a second shallow well in the substrate adjacent the first shallow well, such that a second side of the first shallow well abuts a first side of the second shallow well, the second shallow well comprising a second conductivity type. In some embodiments, the method of forming a semiconductor arrangement comprises forming a first gate over the first shallow well, forming a second gate over the second shallow well, forming a first active area in the first shallow well on a first side of the first gate, forming a second active area in the first shallow well on a second side of the first gate, forming a third active area in the second shallow well on a first side of the second gate, and forming a fourth active area in the second shallow well on a second side of the second gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising:
   a first semiconductor device comprising:
     a first gate over a first shallow well formed in a substrate, the first shallow well comprising a first conductivity type;
     a first active area in the first shallow well on a first side of the first gate; and
     a second active area in the first shallow well on a second side of the first gate;
   a second semiconductor device comprising:
     a second gate over a second shallow well formed in the substrate, the second shallow well comprising a second conductivity type;
     a third active area in the second shallow well on a first side of the second gate; and
     a fourth active area in the second shallow well on a second side of the second gate, a sidewall of the first shallow well abutting a sidewall of the second shallow well; and
   a third semiconductor device comprising:
     a third gate over a third shallow well formed in the substrate, the third shallow well comprising the first conductivity type;
     a fifth active area in the third shallow well on a first side of the third gate; and
     a sixth active area in the third shallow well on a second side of the third gate, a second sidewall of the second shallow well abutting a sidewall of the third shallow well, and wherein:
       the first active area and the sixth active area are coupled to a first voltage supply;
       the first gate, the third active area, the fourth active area and the third gate are coupled to a second voltage supply; and
       the second active area, the second gate and the fifth active area are coupled to a third voltage supply.

2. The semiconductor arrangement of claim 1, at least one of the first active area, the second active area, the third active area, or the fourth active area comprising at least one of a source or a drain.

3. The semiconductor arrangement of claim 1, the substrate comprising at least one of the first conductivity type or the second conductivity type.

4. The semiconductor arrangement of claim 1, at least one of the first shallow well or the second shallow well over at least a portion of a deep well formed in the substrate, the deep well comprising the first conductivity type when the substrate comprises the second conductivity type.

5. The semiconductor arrangement of claim 1, at least one of the first shallow well or the second shallow well over at least a portion of a deep well formed in the substrate, the deep well comprising the second conductivity type when the substrate comprises the first conductivity type.

6. The semiconductor arrangement of claim 1, the third shallow well over at least a portion of a deep well, the deep well comprising the first conductivity type when the substrate comprises the second conductivity type and the deep well comprising the second conductivity type when the substrate comprises the first conductivity type.

7. A semiconductor arrangement comprising:
   a first semiconductor device comprising:
     a first gate over a first shallow well formed in a substrate, the first shallow well comprising a first conductivity type;
     a first active area in the first shallow well on a first side of the first gate, the first active area having the first conductivity type; and
     a second active area in the first shallow well on a second side of the first gate, the second active area having the first conductivity type;
   a second semiconductor device adjacent the first semiconductor device, the second semiconductor device comprising:
     a second gate over a second shallow well formed in the substrate, the second shallow well comprising a second conductivity type; and
     a third active area in the second shallow well on a first side of the second gate, a sidewall of the first shallow well abutting a sidewall of the second shallow well; and
   a third semiconductor device comprising:
     a third gate over a third shallow well, the third shallow well comprising the first conductivity type; and
     a fourth active area in the third shallow well, a second sidewall of the second shallow well abutting a sidewall of the third shallow well.

8. The semiconductor arrangement of claim 7, comprising a deep well in contact with the first shallow well and the second shallow well.

9. The semiconductor arrangement of claim 7, at least one of the first active area, the second active area, the third active area or the fourth active area comprising at least one of a source or a drain.

10. The semiconductor arrangement of claim 7, the substrate comprising at least one of the first conductivity type or the second conductivity type.

11. The semiconductor arrangement of claim 7, at least one of the first shallow well or the second shallow well over a deep well formed in the substrate, the deep well comprising the first conductivity type and the substrate comprising the second conductivity type.

12. The semiconductor arrangement of claim 7, at least one of the first shallow well or the second shallow well over a deep well formed in the substrate, the deep well comprising the second conductivity type and the substrate comprising the first conductivity type.

13. The semiconductor arrangement of claim 7, the third shallow well over at least a portion of a deep well, the deep well comprising the first conductivity type when the substrate comprises the second conductivity type and the deep well comprising the second conductivity type when the substrate comprises the first conductivity type.

14. The semiconductor arrangement of claim 7, wherein:
   the first active area is coupled to a first voltage supply;
   the first gate and the third active area, are coupled to a second voltage supply; and
   the second active area and the second gate are coupled to a third voltage supply.

15. The semiconductor arrangement of claim 7, comprising a deep well in contact with the first shallow well, the second shallow well, and the third shallow well.

16. A semiconductor arrangement comprising:
   a deep well comprising a first conductivity type;
   a first shallow well in contact with the deep well and comprising the first conductivity type;
   a second shallow well in contact with the deep well and in contact with the first shallow well and comprising a second conductivity type;
   a third shallow well in contact with the deep well and in contact with the second shallow well and comprising the first conductivity type;

a first active area in the first shallow well and comprising the first conductivity type;
a second active area in the first shallow well and comprising the first conductivity type;
a first gate over the first shallow well and between the first active area and the second active area;
a third active area in the second shallow well; and
a second gate over the second shallow well.

17. The semiconductor arrangement of claim 16, the third active area comprising the second conductivity type.

18. The semiconductor arrangement of claim 16, the first active area defining a source of a semiconductor device and the second active area defining a drain of the semiconductor device.

19. The semiconductor arrangement of claim 16, comprising:
a fourth active area in the second shallow well, the third active area and the fourth active area comprising the second conductivity type, the second gate between the third active area and the fourth active area.

20. The semiconductor arrangement of claim 16, wherein:
the first active area is coupled to a first voltage supply;
the first gate and the third active area are coupled to a second voltage supply; and
the second active area and the second gate are coupled to a third voltage supply.

* * * * *